(12) United States Patent
Chang et al.

(10) Patent No.: US 11,881,401 B2
(45) Date of Patent: Jan. 23, 2024

(54) METHOD OF FORMING METAL FEATURES

(71) Applicant: Taiwan Semiconductor Manufacturing Company, Ltd., Hsinchu (TW)

(72) Inventors: Po-Chin Chang, Taichung (TW); Li-Te Lin, Hsinchu (TW); Ru-Gun Liu, Hsinchu County (TW); Wei-Liang Lin, Hsinchu (TW); Pinyen Lin, Rochester, NY (US); Yu-Tien Shen, Tainan (TW); Ya-Wen Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 212 days.

(21) Appl. No.: 17/321,529

(22) Filed: May 17, 2021

(65) Prior Publication Data

US 2021/0272807 A1    Sep. 2, 2021

Related U.S. Application Data

(63) Continuation of application No. 16/258,656, filed on Jan. 27, 2019, now Pat. No. 11,043,381.

(51) Int. Cl.
*H01L 21/033* (2006.01)
*H01L 21/311* (2006.01)
*H01L 21/768* (2006.01)
*H01L 21/02* (2006.01)

(52) U.S. Cl.
CPC ...... *H01L 21/0337* (2013.01); *H01L 21/0228* (2013.01); *H01L 21/02118* (2013.01); *H01L 21/31116* (2013.01); *H01L 21/76877* (2013.01)

(58) Field of Classification Search
CPC .......... H01L 21/0337; H01L 21/31116; H01L 21/76877; H01L 21/02118; H01L 21/0228; H01L 21/31144; H01L 21/76816
See application file for complete search history.

(56) References Cited

U.S. PATENT DOCUMENTS

| | | | |
|---|---|---|---|
| 2017/0263460 A1* | 9/2017 | Ruffell | H01L 21/31144 |
| 2018/0047632 A1* | 2/2018 | Zhang | H01L 21/76831 |
| 2019/0189447 A1* | 6/2019 | Kamp | C23C 16/401 |
| 2019/0355581 A1* | 11/2019 | Anglin | H01L 21/67069 |
| 2019/0390341 A1* | 12/2019 | Singhal | H01L 21/0337 |
| 2020/0066575 A1* | 2/2020 | Mignot | H01L 21/7682 |
| 2020/0194271 A1* | 6/2020 | Anglin | H01L 21/67201 |
| 2020/0279806 A1* | 9/2020 | Lin | H01L 21/76816 |

\* cited by examiner

*Primary Examiner* — Julia Slutsker
(74) *Attorney, Agent, or Firm* — JCIPRNET (57) ABSTRACT

A directional patterning method includes following steps. A substrate is provided with a mask layer thereon, and the mask layer has at least one opening pattern therein. A cyclic deposition and etching process is performed to increase a length of the at least one opening pattern.

20 Claims, 12 Drawing Sheets

METHOD OF FORMING METAL FEATURES

CROSS-REFERENCE TO RELATED APPLICATION

This application is a continuation application of and claims the priority benefit of a prior application Ser. No. 16/258,656, filed on Jan. 27, 2019. The entirety of each of the above-mentioned patent applications is hereby incorporated by reference herein and made a part of this specification.

BACKGROUND

Integrated circuit (IC) design becomes more challenging as IC technologies continually progress towards smaller feature sizes, such as 32 nm, 28 nm, 20 nm or less. Smaller feature sizes require ever shrinking pitch (i.e., a center-to-center distance between IC features) and critical dimension (i.e., a smallest achievable dimension for an IC feature). Although existing lithography processes have been generally adequate for their intended purposes, they have not been entirely satisfactory in all respects. For example, the current resolution of a lithography process hinders realization of the smaller feature sizes required for advanced technology nodes. In some cases, additional process step may be required to compensate for the inadequacy of the photolithography process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or step in addition to the orientation depicted in the figures. The apparatus may be otherwise oriented (rotated 90 degrees or at other orientations) and the spatially relative descriptors used herein may likewise be interpreted accordingly.

Figure 1:
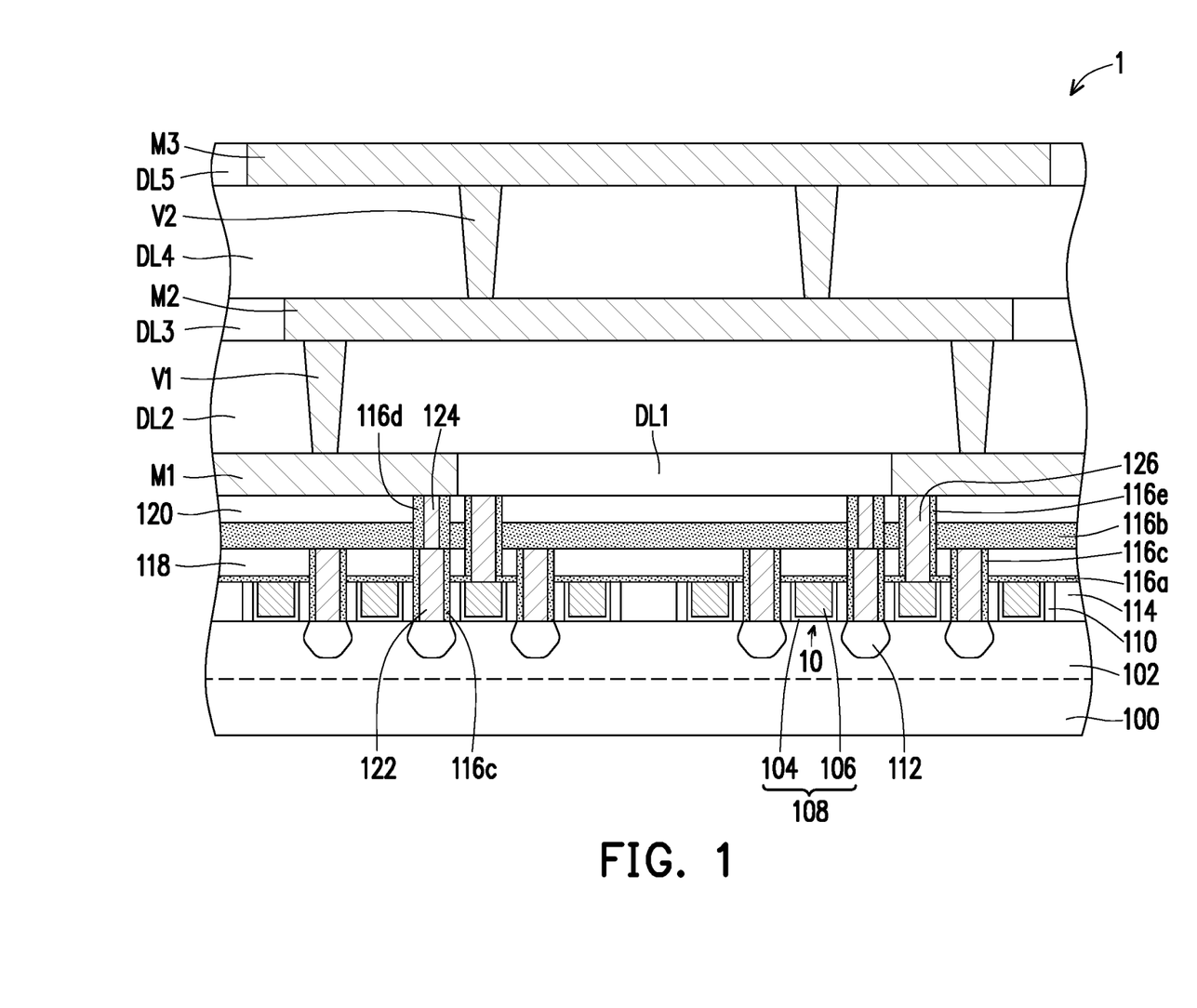
FIG. 1 is a schematic cross-sectional view of an integrated circuit in accordance with some embodiments.

FIG. 1 is a schematic cross-sectional view of an integrated circuit in accordance with some embodiments.

Referring to FIG. 1, an integrated circuit 1 includes at least one device 10. The device 10 may be a portion of an integrated circuit chip or a system on chip (SoC), that includes various passive and active microelectronic devices, such as resistors, capacitors, inductors, fuses, diodes, P-channel field effect transistors (PFETs), N-channel field effect transistors (NFETs), metal-oxide-semiconductor FETs (MOSFETs), complementary MOS (CMOS) transistors, high voltage transistors, high frequency transistors, other suitable components, or combinations thereof. The adjacent devices 10 may have the same or different functions.

In some embodiment, the device 10 includes a substrate 100 having at least one fin 102 and at least one gate stack 108. The substrate 100 and the fin 102 may be made by the same or different materials. The substrate 100 and fin 102 include an elementary semiconductor such as silicon or germanium, a compound semiconductor such as SiC or SiGe, a combination thereof, or the like. The gate stack 108 is across the fin 102. The gate stack 108 includes a gate dielectric layer 104 and a gate 106. In some embodiments, the gate dielectric layer 104 includes a high-k material such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or the like. In some embodiments, the gate 106 includes a work function metal layer and an overlying fill metal layer. The work function metal layer is a P-type work function metal layer or an N-type work function metal layer. The P-type work function metal layer includes TiN, WN, TaN, a combination thereof, or the like. The N-type work function metal layer includes TiAl, TiAlN, TaCN, a combination thereof, or the like. The fill metal layer includes copper, aluminum, tungsten, a combination thereof, or the like. The adjacent gate stacks 108 may include the same or different work function metal layers.

In some embodiment, the device 10 further includes a spacer 110, a strained layer 112 and dielectric layers 114, 118 and 120. The spacer 110 is on the sidewall of the gate stack 108. The strained layer 112 is in the substrate 100 aside the gate stack 108. The spacer 110 includes a nitrogen-containing dielectric material, a carbon-containing dielectric material or both. The strained layer 112 includes a P-type strained layer or an N-type strained layer. The P-type strained layer includes silicon germanium (SiGe). The N-type strained layer includes silicon carbon (SiC), silicon phosphate (SiP), SiCP or a SiC/SiP multi-layer structure. Two adjacent gate stacks 108 may share one strained layer 112 therebetween. The strained layer 112 may be referred to as a "source/drain region". The dielectric layer 114 is formed aside the gate stack 108. The dielectric layer 114 is formed over the substrate 100 filling in gaps between the gate stacks 108. In some embodiments, the top surface of the dielectric layer 114 is substantially coplanar with the top surface of the gate stack 108. The dielectric layer 118 and the dielectric layer 120 are sequentially formed on the dielectric layer 114 and the gate stack 108. In some embodiments, each of the dielectric layers 114, 118 and 120 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiment, the device 10 further includes shielding patterns 116a to 116e, a metal stack 122, a source and drain contact 124 and a gate contact 126. The shielding pattern 116a is over the gate stack 108 and between the dielectric layer 114 and the dielectric layer 118. The shielding pattern 116b is between the dielectric layer 118 and the dielectric layer 120. The metal stack 122 is through the dielectric layers 114 and 118 and is electrically connected to the strained layer 112. In some embodiments, the metal stack 122 is in physical contact with the strained layer 112 and the spacer 110. The shielding pattern 116c is between the metal stack 122 and the spacer 110 and between the metal stack 122 and the dielectric layer 118. In some embodiments, the shielding pattern 116c is in physical contact with the shielding pattern 116a. The source and drain contact 124 is electrically connected to the metal stack 122. The shielding pattern 116d is between the source and the drain contact 124 and the shielding pattern 116b and between the source and drain contact 124 and the dielectric layer 120. The gate contact 126 is electrically connected to the gate stack 108. In some embodiments, the gate contact 126 is through the dielectric layers 118 and 120 and in physical contact with the gate 106 of the gate stack 108. The shielding pattern 116e is between the gate contact 126 and the dielectric layer 118 and between the gate contact 126 and the dielectric layer 120. In some embodiments, the shielding pattern 116e is in physical contact with the shielding patterns 116a and 116b. In some embodiments, each of the metal stack 122, the source and drain contact 124 and the gate contact 126 includes tungsten (W), cobalt (Co), copper (Cu), titanium (Ti), a combination thereof, or the like. In some embodiments, each of the shielding patterns 116a to 116e includes SiN, SiC, SiCN, SiON, SiCON, a combination thereof, or the like.

In some embodiments, the integrated circuit 1 further includes an interconnection layer structure electrically connected to the at least one device 10. The interconnection layer structure includes a plurality of metal features embedded by a plurality of dielectric layers. The metal features include metal layers M1, M2 and M3 and metal vias V1 and V2. The dielectric layers include dielectric layers DL1, DL2, DL3, DL4 and DL5. Specifically, a metal layer M1 is embedded by a dielectric layer DL1, at least one via V1 is embedded by a dielectric layer DL2 and electrically connected to the metal layer M1, a metal layer M2 is embedded by dielectric layer DL3 and electrically connected to the at least one via V1, at least one via V2 is embedded by a dielectric layer DL4 and electrically connected to the metal layer M2, and a metal layer M3 is embedded by dielectric layer DL5 and electrically connected to the at least one via V2. In some embodiments, each of the metal layers M1, M2 and M3 and the metal vias V1 and V2 includes a low resistance metal material and a metal barrier material between the low resistance metal material and the adjacent dielectric layer. The low resistance metal material may include tungsten (W), cobalt (Co), copper (Cu), aluminum (Al), a combination thereof, or the like. The metal barrier material may include Ti, Ta, TiN, TaN, a combination thereof, or the like. In some embodiments, each of the dielectric layers DL1 to DL5 includes a lower etching stop layer and an upper mask layer. The lower etching stop layer may include SiN, SiC, SiOx, TixNy, WxCy, a combination thereof, or the like, wherein x and y are greater than zero. The upper mask layer may include silicon oxide, silicon nitride, silicon carbide, amorphous carbon, a photoresist material, a suitable hard mask material, or a combination thereof.

In some embodiments, each of the metal layers M1, M2 and M3 has a plurality of line patterns substantially parallel to each other. In some embodiments, when two adjacent line patterns extend very long and are disposed close to each other, the line patterns may be broken or bridged and may have a line width roughness (LWR) up to about 4.2 or more when such patterns are defined by a single photolithography process followed by a single etching process. Therefore, a directional patterning method is required to solve these issues.

Figure 2:
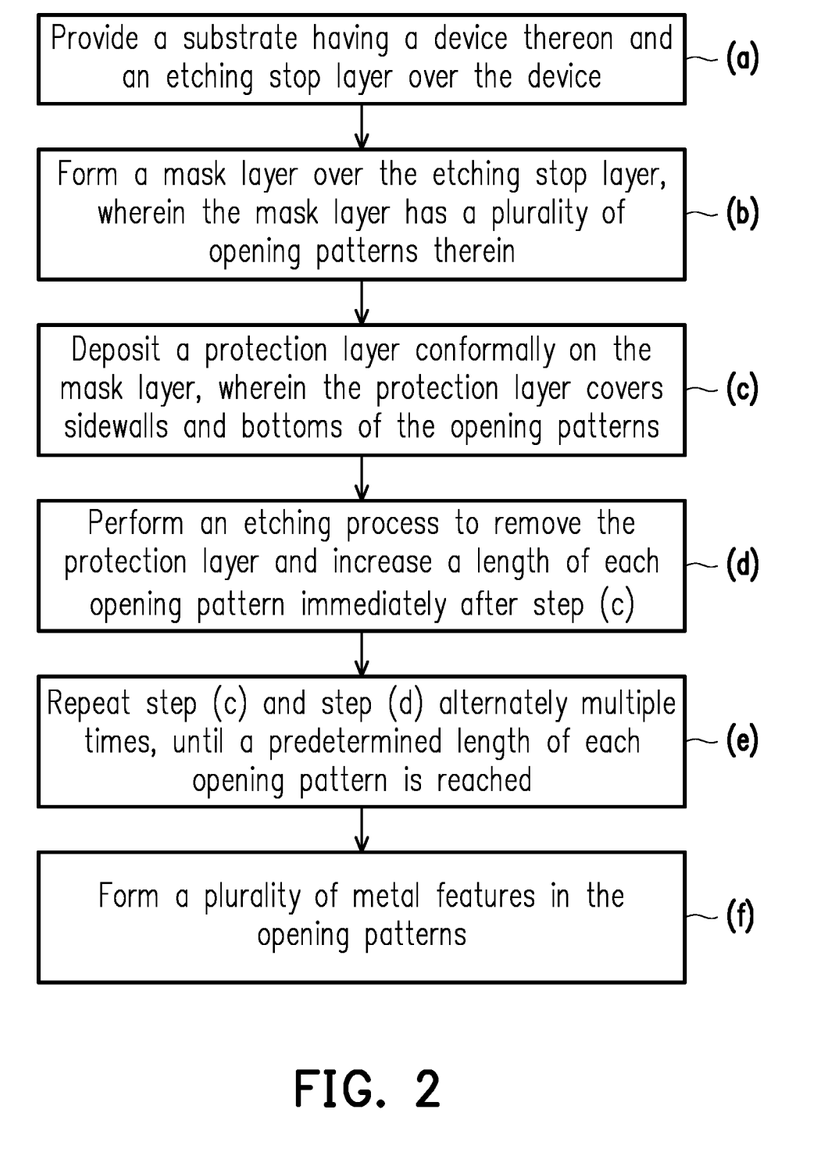
FIG. 2 is a flow chart of a directional patterning method in accordance with some embodiments.

FIG. 2 is a flow chart of a directional patterning method in accordance with some embodiments. FIG. 3A to FIG. 3G are schematic top views of a directional patterning method in accordance with some embodiments. FIG. 4A to FIG. 4G are schematic cross-sectional views taken along the line I-I of FIG. 3A to FIG. 3G. In some embodiments, the directional patterning method may be implemented when fabricating, for example but not limited to, the metal layer M1, M2 or M3 of the integrated circuit 1 in FIG. 1, in which some elements are omitted for the sake of clarity and convenience.

Figure 3A:
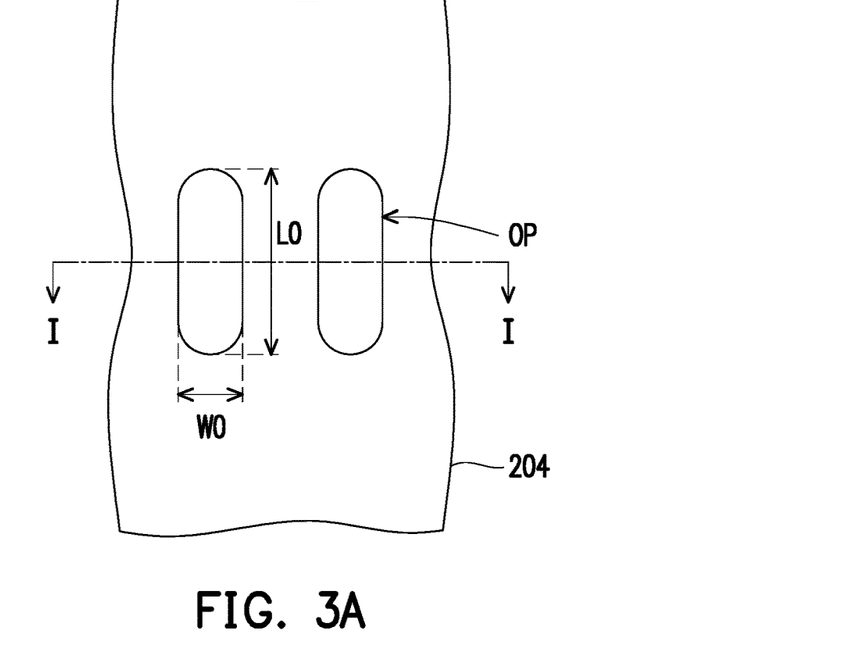
FIG. 3A to FIG. 3G are schematic top views of a directional patterning method in accordance with some embodiments.
Figure 4A:
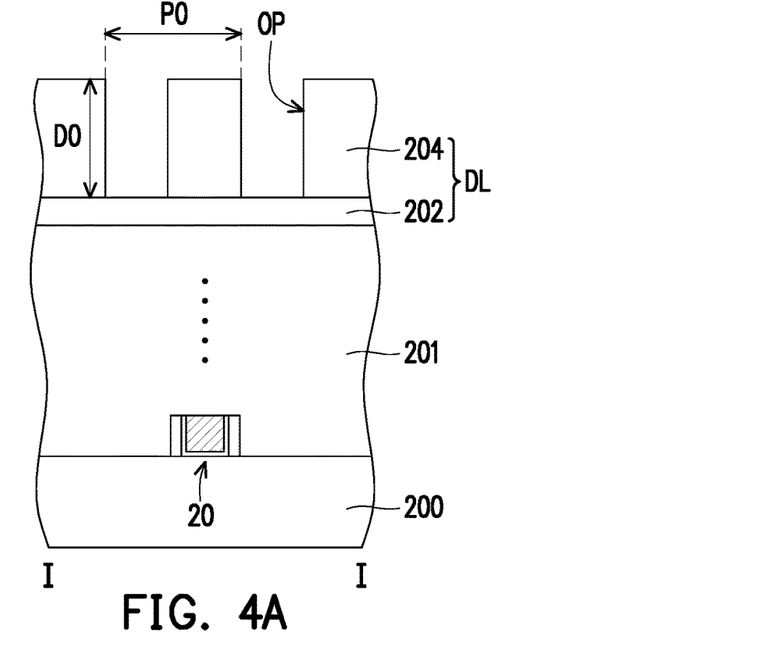
FIG. 4A to FIG. 4G are schematic cross-sectional views taken along the line I-I of FIG. 3A to FIG. 3B.

Referring to FIG. 2, FIG. 3A and FIG. 4A, at step (a), a substrate 200 is provided with a device 20 (e.g., gate strip) thereon and an etching stop layer 202 over the device 10. In some embodiments, the substrate 200 may have a material similar to that of the substrate 100 in FIG. 1. The device 20 may be a portion of an integrated circuit chip or a system on chip (SoC), that includes various passive and active microelectronic devices, such as resistors, capacitors, inductors, fuses, diodes, P-channel field effect transistors (PFETs), N-channel field effect transistors (NFETs), metal-oxide-semiconductor FETs (MOSFETs), complementary MOS (CMOS) transistors, high voltage transistors, high frequency transistors, other suitable components, or combinations thereof. In some embodiments, the device 20 may have a structure similar to that of the device 10 in FIG. 1. In some embodiments, the etching stop layer 202 includes SiN, SiC, SiOx, TixNy, WxCy, a combination thereof, or the like, wherein x and y are greater than zero.

In some embodiments, an interlayer 201 is provided between the device 20 and the etching stop layer 202. The interlayer 201 may include a portion of an interconnection layer structure that is electrically connected to the underlying device 20. For example, the interlayer 201 may include at least one metal feature embedded by at least one dielectric layer.

Still referring to FIG. 2, FIG. 3A and FIG. 4A, at step (b), a mask layer 204 is formed over the etching stop layer 202, wherein the mask layer 204 has a plurality of opening patterns OP therein. In some embodiments, the mask layer 204 includes silicon oxide, silicon nitride, silicon carbide, amorphous carbon, a photoresist material, a suitable hard mask material, or a combination thereof. In some embodiments, the mask layer 204 may be a single-layer structure and may include silicon oxide. In some embodiments, the mask layer 204 may be a multi-layer structure. For example, the mask layer 204 includes a lower mask layer and an upper mask layer, the lower mask layer includes silicon oxide, silicon nitride, amorphous silicon or the like, and the upper mask layer includes amorphous carbon, a photoresist material or the like.

The opening patterns OP of the mask layer 204 may be formed by photolithography etching processes. In some embodiments, the opening patterns OP at step (b) have a line width roughness (LWR) up to about 4.2 or more when they are formed by a single photolithography process followed by a single etching process. In some embodiments, the opening patterns OP are formed through the mask layer 204 and expose the underlying etching stop layer 202. The mask layer 204 and the underlying etching stop layer 202 may constitute a dielectric layer of an interconnection layer structure in some examples.

The adjacent opening patterns OP may have substantially the same dimension. The dimension may include a length, a width and/or a depth. In some embodiments, the opening patterns OP have a width W0, a length L0 and a depth D0 when they are initially formed. The width W0, the length L0 and the depth D0 are referred to as the original width, the original length and the original depth. In some embodiments, the width W0 ranges from about 8 nm to 20 nm, the length L0 ranges from about 8 nm to 50 nm, and the depth D0 ranges from about 20 nm to 150 nm. In some embodiments, the pitch P0 of the opening patterns OP is about 28 nm, 22 nm or less. In some embodiments, the width W0 is substantially the same as the length L0, and the width W0 is half of the pitch P0.

Figure 3B:
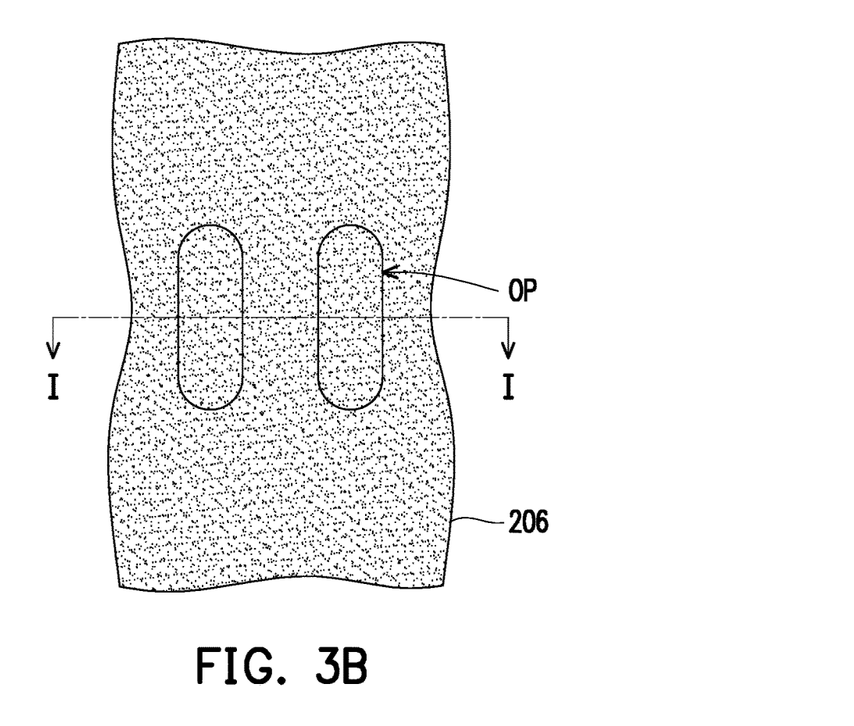
Figure 4B:
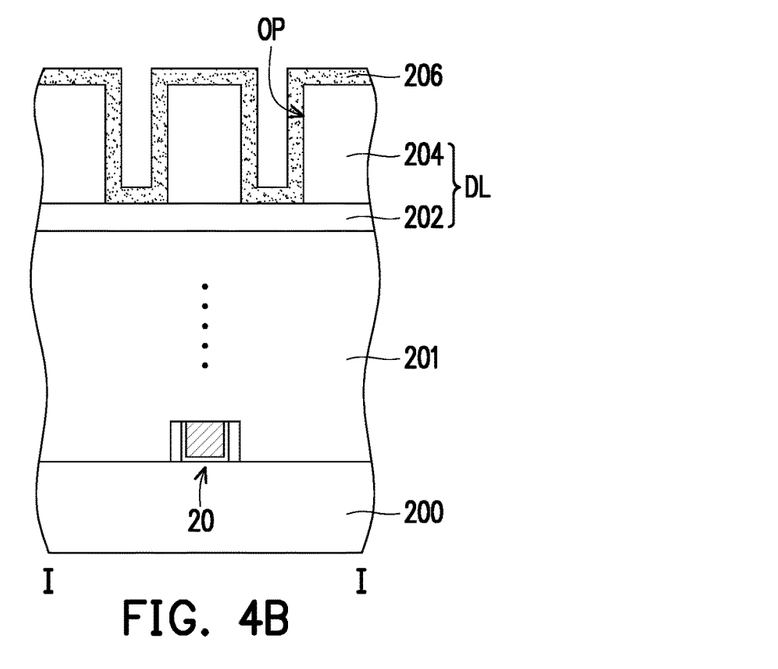

Referring to FIG. 2, FIG. 3B and FIG. 4B, at step (c), a protection layer 206 is deposited conformally on the mask layer 204, wherein the protection layer 206 covers the sidewalls and bottoms of the opening patterns OP.

In some embodiments, the protection layer 206 is a polymer layer formed by an etching chamber. In some embodiments, a first gas is introduced into the etching chamber and a polymer layer is therefore formed on the sidewalls and bottoms of the opening patterns OP. In some embodiments, the first gas includes $CH_4$, $O_2$, $SiCl_4$, HBr, $BCl_3$, $N_2$, $H_2$ or a combination thereof. In some embodiments, the first gas for polymer deposition may be a single gas. In some embodiments, the first gas for polymer deposition may be a mixed gas. For example, the first gas includes HBr, a combination of $CH_4$ and $O_2$, a combination of $SiCl_4$ and $O_2$, a combination of $BCl_3$ and $N_2$, a combination of $BCl_3$ and $H_2$ or a combination of $BCl_3$ and $O_2$.

In alternative embodiments, the protection layer 206 is a dielectric layer formed by a deposition chamber such as an atomic layer deposition chamber. For example, the dielectric layer includes silicon oxide, silicon nitride, metal oxide, metal nitride, metal carbide or a combination thereof. The metal oxide may be a high-k material, such as $HfO_2$ or $ZrO_2$. The metal nitride may be WN or AlN. The metal carbide may be $Ta_4C_3$.

Figure 3C:
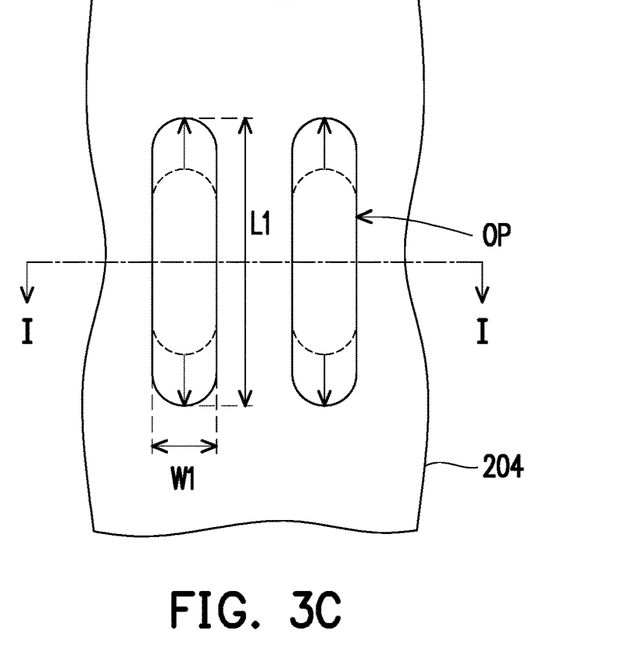
Figure 4C:
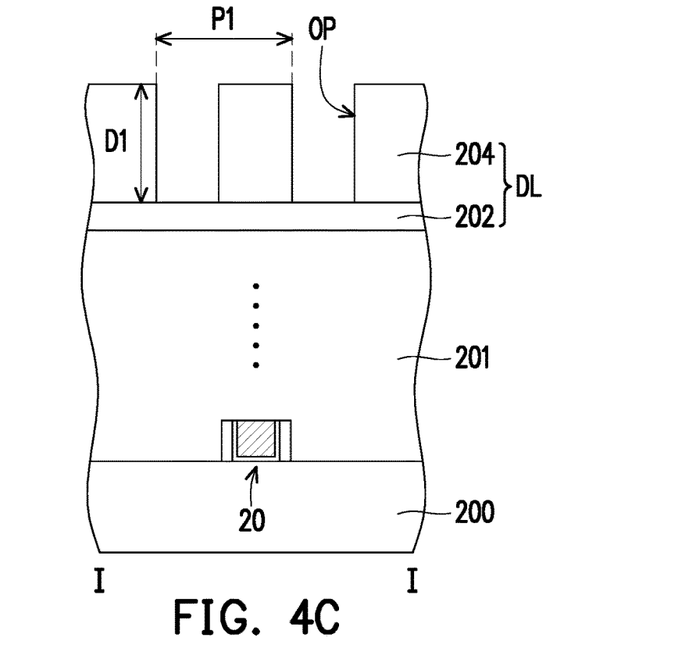

Referring to FIG. 2, FIG. 3C and FIG. 4C, at step (d), an etching process is performed immediately after step (c) to remove the protection layer 206 and increase the length of each opening pattern OP. In some embodiments, a second gas is introduced into the etching chamber for performing an etching process to elongate the opening patterns OP. In some embodiments, the second gas includes $CHF_3$, $CH_2F_2$, $CF_4$, $O_2$, Ar, $CH_3F$, $N_2$, $SF_6$, HBr, $NF_3$, He or a combination thereof. Specifically, the second gas etches the protection layer 206 away and partially removes the mask layer 204 along the length direction of the opening patterns OP. Accordingly, the length of the opening patterns OP is increased. Upon the etching process at step (d), the protection layer 206 may be completely etched away, or may slightly remain on the sidewalls of the opening patterns OP. In some embodiments, the etching process at step (d) is referred to as a "directional etching process". Specifically, in the directional etching process, only one dimension (e.g., length) of the opening patterns OP is increased, while other dimensions (e.g., width and depth) of the opening patterns OP maintain substantially unchanged or the change in dimensions of the opening patterns OP is less than about 10%, 5% or 3%. In some embodiments, the change in the width or depth is less than about 5 nm or 2 nm. In some embodiments, the opening patterns OP obtained at step (d) have a width W1, a length L1 and a depth D1. The width W1 is substantially the same as the width W0. The depth D1 is substantially the same as the width D0. The length L1 is greater than the length L0.

In the disclosure, the directional etching process at step (d) is performed immediately after the protection layer forming process at step (c). Specifically, step (c) and step (d) are performed successively without an additional treatment step such as an implantation step. The directional etching process along the opening's length direction is mainly controlled by the etching recipes in combination with element configuration in the etching chamber, and the protection layer helps to protect the opening patterns from being broadened or deepened during the directional etching process.

Figure 3D:
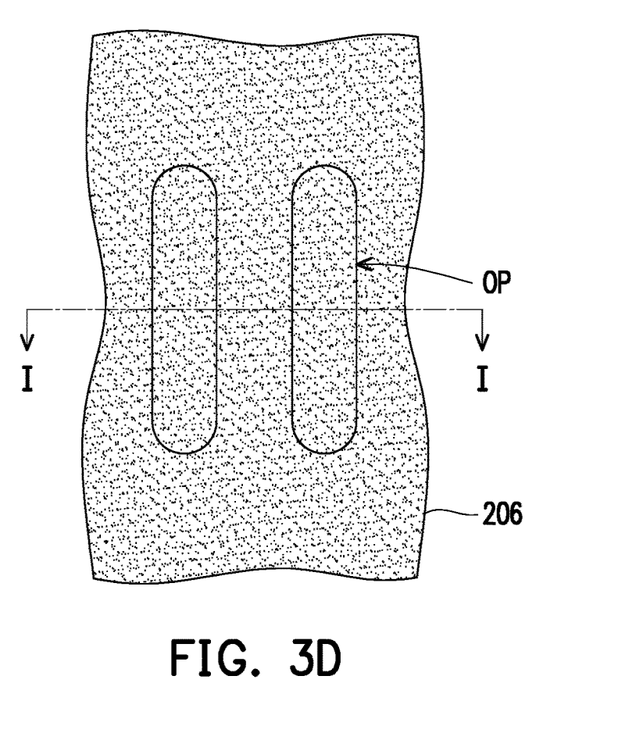
Figure 3E:
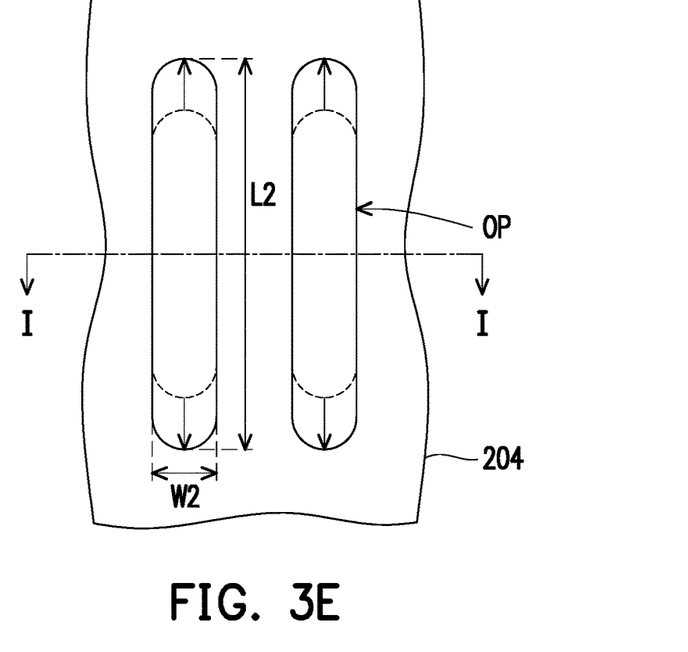
Figure 3F:
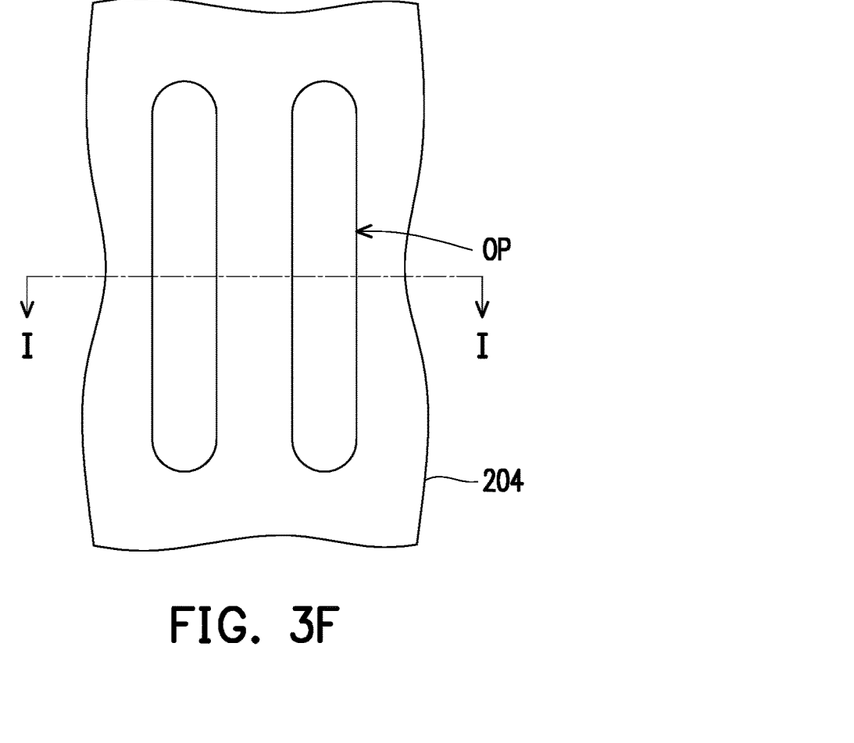
Figure 3G:
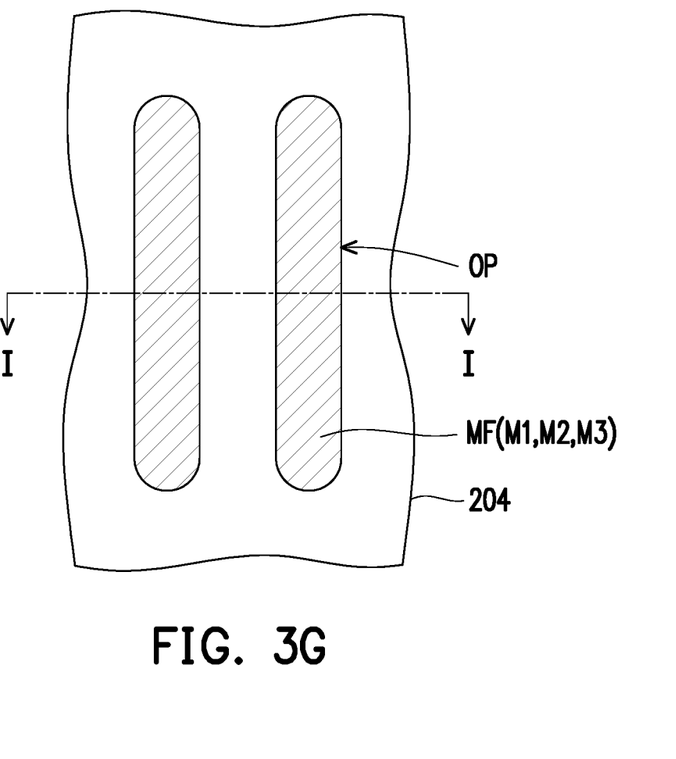
Figure 4D:
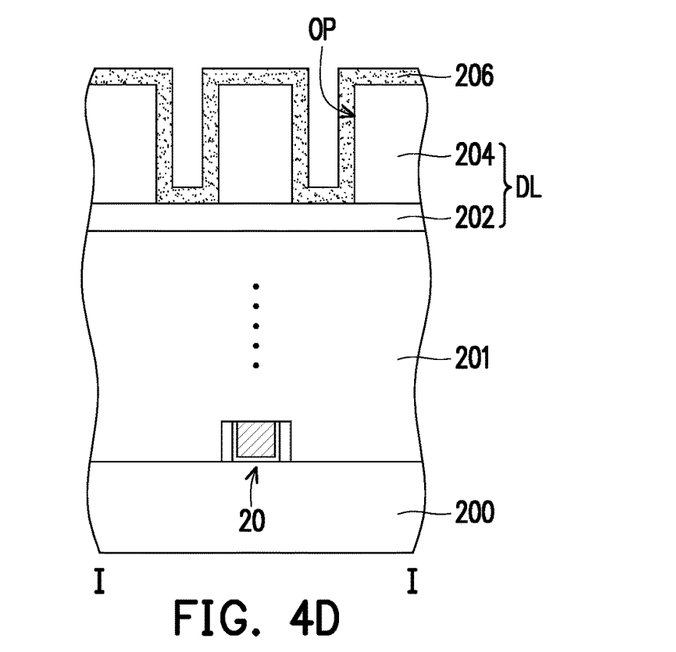
Figure 4E:
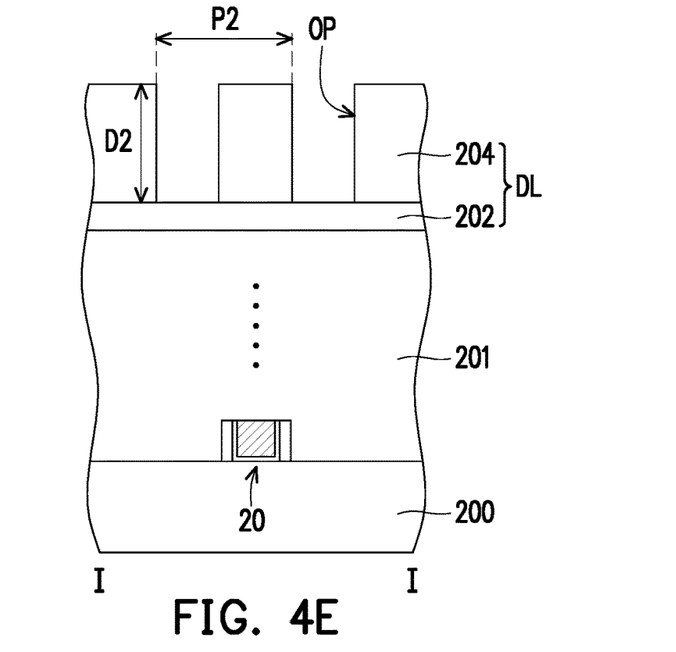

Referring to FIG. 2, FIGS. 3D-3E and FIGS. 4D-4E, at step (e), step (c) and step (d) are repeated alternately multiple times until a predetermined length of each opening pattern OP is reached. In some embodiments, another protection layer 206 is deposited conformally on the mask layer 204, and covers the sidewalls and bottoms of the opening patterns OP, as shown in FIG. 3D and FIG. 4D. Thereafter, an etching process is performed to remove the protection layer 206 and increase the length of each opening pattern OP, as shown in FIG. 3E and FIG. 4E. In some embodiments, the opening patterns OP obtained at step (e) have a width W2, a length L2 and a depth D2. The width W2 is substantially the same as the width W1. The depth D2 is substantially the same as the depth D1. The length L2 is greater than the length L1. In this embodiment, step (c) and step (d) are repeated one time, so the predetermined length is the length L2, but the disclosure is not limited thereto. In some embodiments, step (c) and step (d) are repeated as many times as desired. In some embodiments, the predetermined length is at least two times, three times, five times, ten times or fifteen times the original length L0 of the opening patterns OP. For example, the predetermined length is about 2.5 to 5.5 times the original length L0 of the opening patterns OP.

From another point of view, step (c) and step (d) constitute a cycle of a cyclic deposition and etching process. In the cyclic deposition and etching process, a deposition step and an etching step performed successively and circularly without interruption. The above embodiments in which the cyclic deposition and etching process includes two cycles of deposition and etching steps are provided for illustration purposes, and are not construed as limiting the present disclosure. The cyclic deposition and etching process may include m cycles of deposition and etching steps, and m is a positive integer. For examples, m is an integer from 1 to 50. In some embodiments, step (c) and step (d) are repeated m times, where m is an integer between 1 and 50, between 5 and 30, or between 10 and 20.

The cyclic deposition and etching process are beneficial to reduce the line width roughness (LWR) of the opening patterns OP. In some embodiments, the line width roughness (LWR) of the opening patterns OP at step (e) is less than that of the opening patterns at step (b). In some embodiments, the opening patterns OP obtained at step (e) have a line width roughness (LWR) of about 2.8 or less.

The cyclic deposition and etching process may be performed in the same chamber or different chambers. In some embodiments, step (c) and step (d) are performed in the same chamber (e.g., etching chamber) when the protection layer is a polymer layer formed in the etching chamber.

In alternative embodiments, step (c) and step (d) are performed in different chambers. For example, when the protection layer is a dielectric layer, step (c) is performed in a deposition chamber (e.g., ALD chamber) while step (d) is performed in an etching chamber.

Figure 4F:
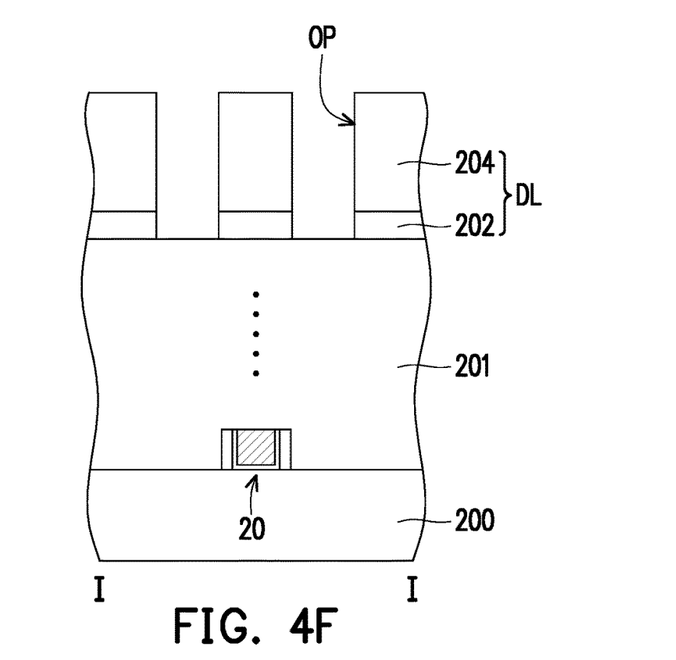

Referring to FIG. 2, FIGS. 3F-3G and FIGS. 4F-4G, at step (f), metal features MF are formed in the opening patterns OP of the mask layer 204. In some embodiments, the metal features MF are metal lines electrically connected to the underlying device 20. In some embodiments, before step (f) is performed, the etching stop layer 202 is patterned by using the opening patterns obtained at step (e) as a mask, as shown in FIG. 4F. The opening patterns OP penetrate through the etching stop layer 202 and expose the underlying metal feature such as vias (not shown). In some embodiments, each metal feature MF includes a low resistance metal material and a metal barrier material between the low resistance metal material and the adjacent dielectric layer. The low resistance metal material may include tungsten (W), cobalt (Co), copper (Cu), aluminum (Al), a combination thereof, or the like. The metal barrier material may include Ti, Ta, TiN, TaN, a combination thereof, or the like. In some embodiments, the method of forming the metal features MF includes performing a chemical vapor deposition process, an electroplating process or the like.

Figure 4G:
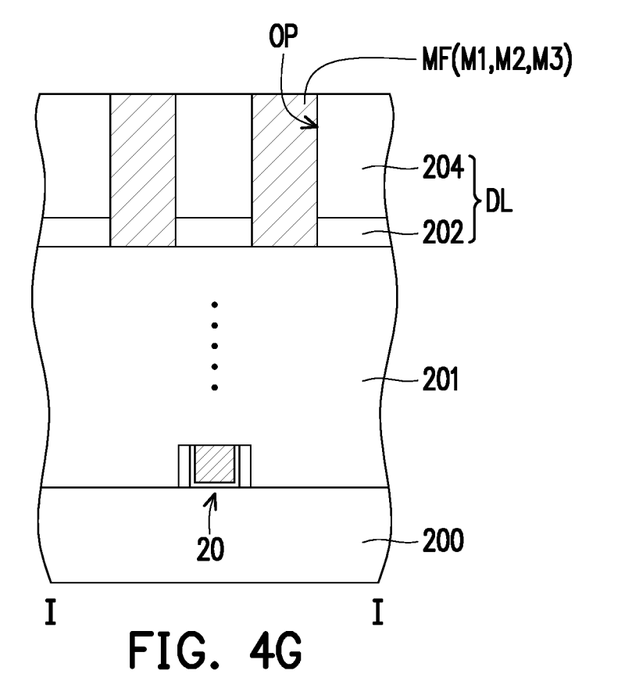

The above embodiments of FIG. 4G in which the metal features MF (e.g., metal lines) are parallel to the underlying device (e.g., gate strip) are provided for illustration purposes, and are not construed as limiting the present disclosure. In some embodiments, from a top view, the metal features MF (e.g., metal lines) may be perpendicular to the underlying device (e.g., gate strip), or may intersect with (but not perpendicular to) the underlying device (e.g., gate strip).

Figure 5:
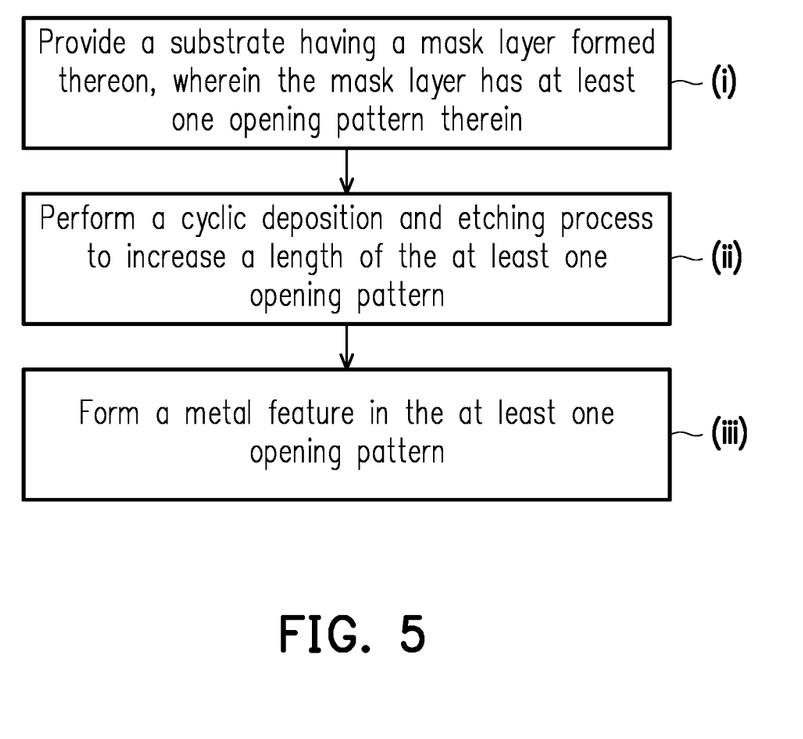
FIG. 5 is a flow chart of a directional patterning method in accordance with alternative embodiments.
Figure 6:
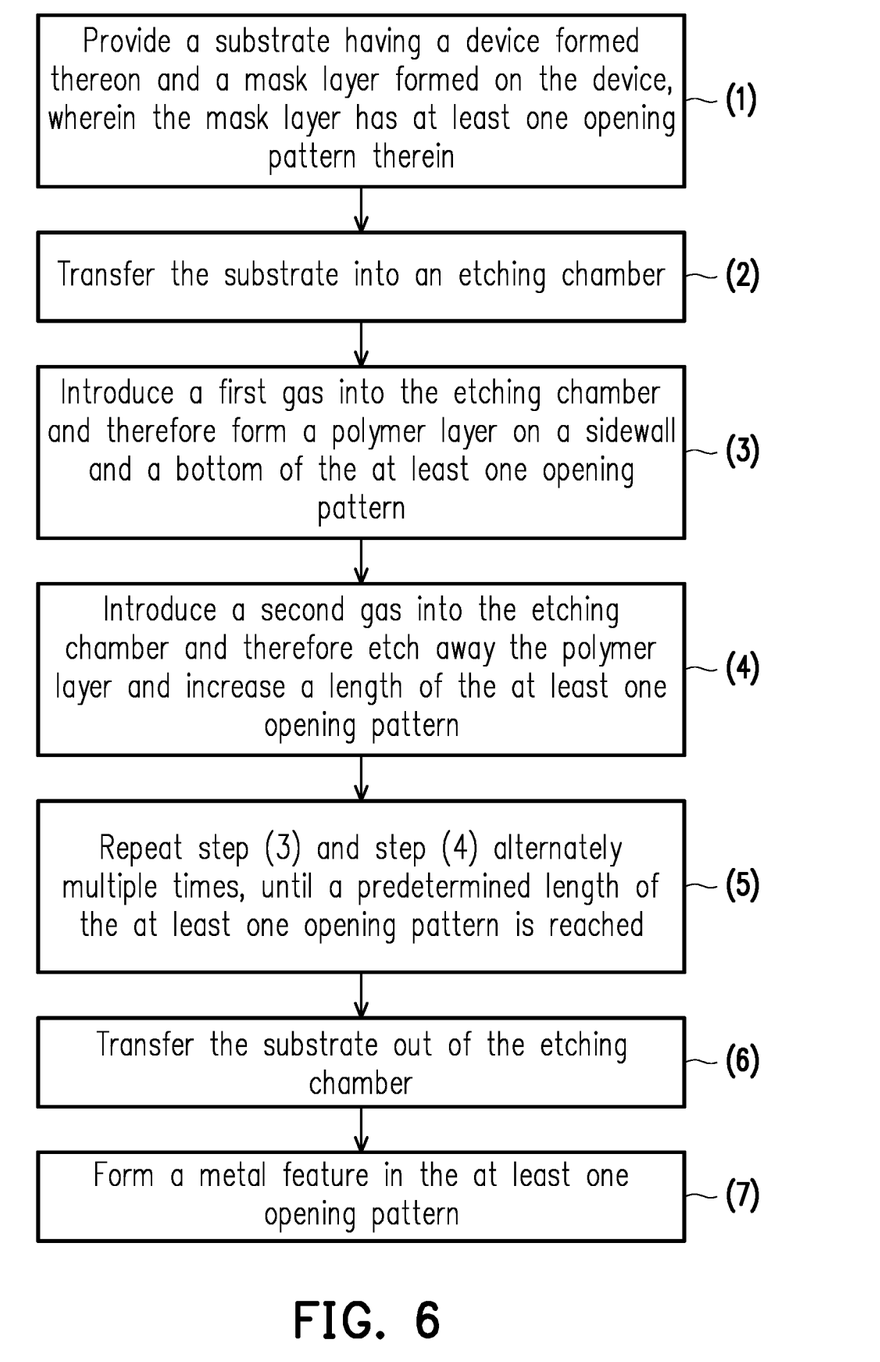
FIG. 6 is a flow chart of a directional patterning method in accordance with some alternative embodiments.

In some embodiments, the present disclosure further provides directional patterning methods as shown in FIG. 5 and FIG. 6.

Referring to FIG. 5, at step (i), a substrate is provided with a mask layer thereon, wherein the mask layer has at least one opening pattern therein. In some embodiments, step (i) of FIG. 5 may include step (a) and step (b) of FIG. 2. At step (ii), a cyclic deposition and etching process is performed to increase a length of the at least one opening pattern. In some embodiments, step (ii) of FIG. 5 may include step (c) to step (e) of FIG. 2. At step (iii), a metal feature is formed in the at least one opening pattern. In some embodiments, step (iii) of FIG. 5 may include step (f) of FIG. 2.

Referring to FIG. 6, at step (1), a substrate is provided with a device formed thereon and a mask layer formed on the device, wherein the mask layer has at least one opening pattern therein. In some embodiments, step (1) of FIG. 6 may include step (a) and step (b) of FIG. 2. At step (2), the substrate is transferred into an etching chamber. At step (3), a first gas is introduced into the etching chamber and a polymer layer is therefore formed on a sidewall and a bottom of the at least one opening pattern. In some embodiments, step (3) of FIG. 6 may be similar to step (c) of FIG. 2. At step (4), a second gas is introduced into the etching chamber, and therefore, the polymer layer is etched away and the length of the at least one opening pattern is increased. In some embodiments, step (4) of FIG. 6 may be similar to step (d) of FIG. 2. At step (5), step (3) and step (4) are repeated alternately multiple times, until a predetermined length of the at least one opening pattern is reached. In some embodiments, step (5) of FIG. 6 may be similar to step (e) of FIG. 2. At step (6), the substrate is transferred out of the etching chamber. At step (7), a metal feature is formed in the at least one opening pattern. In some embodiments, step (7) of FIG. 6 may be similar to step (f) of FIG. 2.

The above embodiments in which the directional patterning method is applied to form metal lines of an interconnection layer structure are provided for illustration purposes, and are not construed as limiting to the present disclosure. In some embodiments, the directional patterning method may be applied to form strip-like or slot-shaped vias.

In view of the above, with the directional patterning method of the disclosure, metal features (e.g., metal lines or strip-like vias) arranged in parallel with a narrow pitch can be well defined without pattern broken or bridged. Besides, the cyclic deposition and etching process of the disclosure is beneficial to reduce the line width roughness (LWR) of the metal features to about 2.8 or less.

In accordance with some embodiments of the present disclosure, a directional patterning method includes following steps. A substrate is provided having a mask layer thereon, and the mask layer has at least one opening pattern therein. A cyclic deposition and etching process is performed to increase a length of the at least one opening pattern.

In accordance with alternative embodiments of the present disclosure, a directional patterning method includes the following steps. A substrate is provided with a device thereon and an etching stop layer over the device. A mask layer is formed over the etching stop layer, wherein the mask layer has a plurality of opening patterns therein. A protection layer is deposited conformally on the mask layer and coves sidewalls and bottoms of the opening patterns. An etching process is performed to remove the protection layer and increase a length of each opening pattern immediately after the deposition step. The deposition step and the etching step are repeated alternately multiple times, until a predetermined length of each opening pattern is reached. A plurality of metal features is formed in the opening patterns.

In accordance with yet alternative embodiments of the present disclosure, a directional patterning method includes the following steps. A substrate is provided with a device formed thereon and a mask layer formed on the device, wherein the mask layer has at least one opening pattern therein. The substrate is transferred into an etching chamber. A first gas is introduced into the etching chamber and a polymer layer is therefore formed on a sidewall and a bottom of the at least one opening pattern. A second gas is introduced into the etching chamber, and therefore, the polymer layer is etched away and a length of the at least one opening pattern is increased. The first gas introducing step and the second gas introducing step are repeated alternately multiple times, until a predetermined length of the at least one opening pattern is reached. The substrate is transferred out of the etching chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming metal features, comprising:
providing a substrate having a dielectric layer thereon, wherein the dielectric layer has opening patterns therein, and each of the opening patterns has a width and a length greater than the width and extending along a longitudinal direction thereof;
performing a cyclic treatment process to increase the length, from a top view, of each of the opening patterns along the longitudinal direction thereof and simultaneously push two opposite sidewalls of each of the opening patterns away from each other; and
forming metal features in the opening patterns after the cyclic treatment process,
wherein a cycle of the cyclic treatment process comprises:
forming a protection layer conformally on the dielectric layer, wherein the protection layer covers a sidewall and a bottom of each of the opening patterns; and
forming a directional etching process to completely remove the protection layer and simultaneously increase the length of each of the opening patterns.

2. The method of claim 1, wherein the cyclic treatment process comprises performing the cycle at least two times.

3. The method of claim 2, wherein the cycles of the cyclic treatment process are performed successively and circularly without interruption.

4. The method of claim 1, wherein the opening patterns after the cyclic treatment process have a line width roughness (LWR) of about 2.8 or less.

5. The method of claim 1, wherein the protection layer is a polymer layer formed by an etching chamber.

6. The method of claim 1, wherein the protection layer is a dielectric layer formed by an atomic layer deposition chamber.

7. The method of claim 1, wherein the opening patterns are arranged parallel to each other, and the length of each of the opening patterns after the cyclic treatment process is at least two times the length of each of the opening patterns before the cyclic treatment process.

8. The method of claim 1, wherein the metal features are metal lines or strip-like vias.

9. The method of claim 1, wherein a change in a width or a depth of each of the opening patterns after the cyclic treatment process is less than about 10%.

10. A method of forming metal features, comprising:
providing a substrate having a device thereon and an interlayer over the device;
forming an etching stop layer over the interlayer;
forming a mask layer over the etching stop layer, wherein the mask layer has opening patterns therein, and each of the opening patterns has a width and a length greater than the width and extending along a longitudinal direction thereof;
performing a directional etching process to the opening patterns, so as to increase the length of each of the opening patterns and simultaneously push two opposite sidewalls of each of the opening patterns away from each other, wherein the length of each of the opening patterns after the directional etching process is at least two times the length of each of the plurality of opening patterns before the directional etching process;
after the directional etching process, transferring the opening patterns to the etching stop layer; and
forming metal features in the opening patterns,
wherein the directional etching process comprises:
performing a depositing step to form a protection layer conformally on the mask layer, wherein the protection layer covers sidewalls and bottoms of the opening patterns;
performing an etching step to completely remove the protection layer and simultaneously increase the length of each of the opening patterns along the longitudinal direction thereof; and
repeating the deposition step and the etching step alternately multiple times.

11. The method of claim 10, wherein the opening patterns after the directional etching process have a line width roughness (LWR) of about 2.8 or less.

12. The method of claim 10, wherein the depositing step and the etching step are performed in the same chamber.

13. The method of claim 10, wherein the depositing step and the etching step are performed in different chambers.

14. The method of claim 10, wherein the protection layer is a polymer layer formed by an etching chamber.

15. The method of claim 10, wherein the protection layer is a dielectric layer formed by an atomic layer deposition chamber.

16. The method of claim 10, wherein a pitch of the opening patterns is about 28 nm or less.

17. A method of forming metal features, comprising:
providing a substrate having a device formed thereon and a mask layer formed on the device, wherein the mask layer has opening patterns therein, and each of the opening patterns has a width and a length greater than the width and extending along a longitudinal direction thereof;
transferring the substrate into a process chamber;
performing a cyclic treatment process by introducing a first gas and a second gas into the process chamber alternately multiple times, so as to increase the length, from a top view, of each of the opening patterns along the longitudinal direction thereof and simultaneously push two opposite sidewalls of each of the opening patterns away from each other;
transferring the substrate out of the process chamber; and
forming metal features in the opening patterns,
wherein a cycle of the cyclic treatment process comprises:
forming a protection layer conformally on the dielectric layer, wherein the protection layer covers a sidewall and a bottom of each of the opening patterns; and
forming a directional etching process to completely remove the protection layer and simultaneously increase the length of each of the opening patterns.

18. The method of claim 17, wherein the process chamber is an etching chamber.

19. The method of claim 17, wherein the first gas is selected from at least one of the group consisting of $CH_4$, $O_2$, $SiCl_4$, HBr, $BCl_3$, $N_2$, and $H_2$.

20. The method of claim 17, wherein the second gas is selected from at least one of the group consisting of $CHF_3$, $CH_2F_2$, $CF_4$, $O_2$, Ar, $CH_3F$, $N_2$, $SF_6$, HBr, $NF_3$, and He.

* * * * *